United States Patent
Verhoeckx et al.

(10) Patent No.: US 6,686,581 B2
(45) Date of Patent: Feb. 3, 2004

(54) LIGHT EMITTING DEVICE INCLUDING AN ELECTROCONDUCTIVE LAYER

(75) Inventors: Godefridus Johannes Verhoeckx, Eindhoven (NL); Nicolaas Joseph Martin Van Leth, Eindhoven (NL); Cornelis Gerardus Visser, Eindhoven (NL)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/891,666

(22) Filed: Jun. 26, 2001

(65) Prior Publication Data

US 2002/0014838 A1 Feb. 7, 2002

(30) Foreign Application Priority Data

Jun. 29, 2000 (EP) .............................. 00202263

(51) Int. Cl.$^7$ .......................... H01J 40/14; C25D 13/02
(52) U.S. Cl. ................... 250/214 R; 204/484
(58) Field of Search ................ 250/552, 553, 250/214 R, 462.1, 458.1, 459.1, 484.4; 204/485–488, 490

(56) References Cited

U.S. PATENT DOCUMENTS

| 4,482,447 A | | 11/1984 | Mizuguchi et al. ..... 204/181 N |
| 5,226,053 A | * | 7/1993 | Cho et al. .................... 372/45 |
| 5,296,117 A | | 3/1994 | De Jaeger et al. ....... 204/181.5 |
| 5,557,115 A | * | 9/1996 | Shakuda ........................ 257/81 |
| 5,653,017 A | * | 8/1997 | Cathey et al. ................ 29/830 |
| 5,813,752 A | * | 9/1998 | Singer et al. ............... 362/293 |
| 5,813,753 A | | 9/1998 | Vriens et al. ............... 362/293 |
| 5,952,681 A | | 9/1999 | Chen ........................... 257/89 |
| 6,090,434 A | | 7/2000 | Sugiura et al. ............... 427/64 |
| 6,153,075 A | * | 11/2000 | Nemelka ..................... 204/485 |
| 6,203,681 B1 | | 3/2001 | Yang .......................... 204/489 |
| 6,236,060 B1 | * | 5/2001 | Chan et al. .................... 257/13 |
| 6,245,259 B1 | | 6/2001 | Höhn et al. ............. 252/301.36 |
| 6,373,188 B1 | | 4/2002 | Johnson et al. ............. 313/506 |
| 6,414,431 B1 | * | 7/2002 | Yu et al. ..................... 313/504 |

FOREIGN PATENT DOCUMENTS

| JP | 55-46407 | 4/1980 |
| WO | WO 97/48138 | 12/1997 |
| WO | WO 00/24024 | 4/2000 |

OTHER PUBLICATIONS

K. Murakami et al., "Compound semiconductor lighting based on InGaN ultraviolet LED and ZnS phosphor system", 2000 IEEE International Symposium on Compound Semiconductors, 2000, pp. 449–454.

* cited by examiner

Primary Examiner—Stephone B. Allen
(74) Attorney, Agent, or Firm—Patent Law Group LLP

(57) ABSTRACT

A LED is covered with an electroconductive layer, and a luminescent layer is deposited on the electroconductive layer by electrophoresis. The conductivity of the electroconductive layer is chosen to be such that the layer can be used as one of the electrodes during the electrophoresis, while the LED is not short-circuited by the electroconductive layer during normal operation.

35 Claims, 1 Drawing Sheet

LIGHT EMITTING DEVICE INCLUDING AN ELECTROCONDUCTIVE LAYER

BACKGROUND OF THE INVENTION

1. Field of the Invention

The invention relates to an optoelectric element having a semiconductor body provided on a substrate formed from an electrically insulating material and covered with a luminescent layer for converting electromagnetic radiation of a first wavelength range generated by the semiconductor body into visible light of a different wavelength range.

The invention also relates to a method of covering an optoelectric element with a luminescent layer.

2. Description of the Related Art

A prior art optoelectronic element as just mentioned is disclosed in U.S. Pat. No. 5,813,752. In the known optoelectric element, the semiconductor body and the substrate form part of a LED. The luminescent layer converts UV light or blue light generated by the LED into visible light of a different wavelength range. In this manner, such LEDs can be made suitable for use in different applications requiring visible light of different colors. The problem is, however, that it is often difficult to apply the luminescent layer onto the optoelectric element in such a manner that a closely contacting layer of a readily controlled and substantially uniform thickness is obtained.

SUMMARY OF THE INVENTION

Therefore, it is an object of the invention to provide an optoelectric element comprising a closely contacting luminescent layer of uniform thickness, which can be provided in a comparatively simple manner.

To achieve this, an optoelectric element in accordance with the invention further includes an electroconductive layer situated between the substrate and the luminescent layer, the electric conductivity X of which is chosen to be such that, during operation of the optoelectric element, the current through the electroconductive layer is at most 5% of the current through the semiconductor element.

In practice, the electroconductive layer usually connects different electrodes of the optoelectric element to each other. The electric conductivity of this layer is chosen to be so low that the layer does not cause a short-circuit between the electrodes of the optoelectric element, and that the functioning of the optoelectric element is hardly adversely affected. Surprisingly, it has been found that, at the same time, the conductivity is high enough to deposit luminescent material from a suitably chosen slurry by electrophoresis, in which process the electroconductive layer serves as one of the electrodes. In this manner, a closely contacting luminescent layer forming part of the optoelectric element can be readily provided in a uniform thickness, the optoelectric properties of the optoelectric element not being adversely affected by the conductive layer.

It has been found that an optoelectric element in accordance with the invention can be embodied such that, during operation of the optoelectric element, the current through the electroconductive layer is at most 1% of the current through the semiconductor element.

An optoelectric element in accordance with the invention has a comparatively high efficiency if the electroconductive layer is transparent to electromagnetic radiation generated by the semiconductor element.

Favorable results were achieved using embodiments of an optoelectric element in accordance with the invention, wherein the electroconductive layer comprises a transparent oxide, more particularly an oxide selected from the group formed by indium tin oxide, antimony tin oxide and tin oxide, and wherein the semiconductor body forms part of an LED.

The present invention provides a method for covering an optoelectric element comprising a semiconductor body provided on an electrically insulating substrate. The method comprises a step wherein the substrate is covered with an electroconductive layer, after which at least the substrate is brought into contact with a suspension of a luminescent material. The luminescent material is thereafter deposited by electrophoresis on the surface of the electroconductive layer, said electroconductive layer serving as a first electrode, and a second electrode being present in the suspension. A potential difference between the electrodes is maintained, and the electric conductivity X of the electroconductive layer is higher than that of the suspension and lower than that of the semiconductor element.

It has been found that the method can very suitably be used to cover an optoelectric element comprising an LED.

It has also been found that the method in accordance with the invention can be advantageously applied to an optoelectric element connected to a carrier plate on which also a number of optoelectric elements are provided, so that all these optoelectric elements are simultaneously covered with a luminescent layer.

BRIEF DESCRIPTION OF THE DRAWINGS

These and other aspects of the invention will be apparent from and elucidated with reference to the embodiment(s) described hereinafter.

In the drawings.

DETAILED DESCRIPTION OF THE PRESENTLY PREFERRED EMBODIMENT

Figure 1:
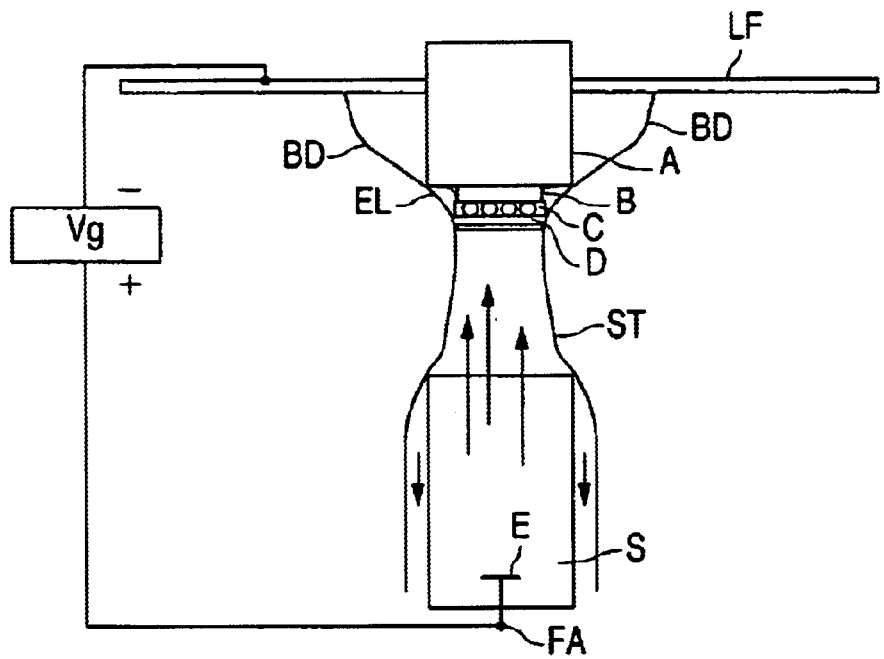
FIG. 1 shows an example of a step in a method in accordance with the invention.

In FIG. 1, LF denotes a carrier plate of an electroconductive material. A denotes a heat sink, which is provided in a hole in the carrier plate LF and which is made from a metal. On the heat sink A there is provided a submount B composed of a Si wafer covered with a layer of aluminum. Ends of the submount B are connected to respective bonding wires, which are each connected to the carrier plate LF. D denotes a LED, which comprises a substrate made from an electrically insulating ceramic material on which a number of epitaxial layers consisting of a semiconductor material are provided. These epitaxial layers jointly form a semiconductor body. C denotes solder balls forming electric contacts between LED D and submount B. ST denotes a droplet of a suspension S of a luminescent material. The droplet ST is in contact with a part of the outside surface of heat sink A, submount B, contacts C and LED D. The part of the outside surface of heat sink A, submount B, contacts C and LED D contacting the suspension is provided with an electroconductive layer EL, the electric conductivity of which is chosen to be higher than that of the suspension, yet lower than that of the semiconductor body. The suspension is displaced by means of a pump in a direction indicated by means of the arrows, so that the part of the suspension that is near to the surface of the LED D is renewed continuously. A cathode of a voltage source Vg is connected via the carrier plate LF and via the bonding wires BD to the electroconductive layer, so that this layer forms a cathode which is in contact with the suspension. An anode of voltage source Vg is connected to an electrode E placed in the suspension. Under the influence of a voltage V generated by the voltage source, a layer of a luminescent material is deposited by means of electrophoresis on the surface of the electroconductive layer.

In a practical embodiment of the step of the method shown in FIG. 1, the electroconductive layer is made of antimony tin oxide and has a thickness of approximately 50 nm. This electroconductive layer is provided by moistening the surface of the optoelectric element with a solution of antimony tin oxide. The optoelectric element comprises a sapphire substrate on which a semiconductor body is provided consisting of epitaxial layers AlGaInN. If a current flows through this semiconductor body, then blue light is generated. The suspension used contains strontium phosphate. The electric conductivity of this suspension is approximately 300 pS/m. It has been found that, under the influence of a voltage of 200 volts, the surface of the LED D is electrophoretically covered with a luminescent layer of approximately 50 $\mu$m in 50 seconds.

Figure 2:
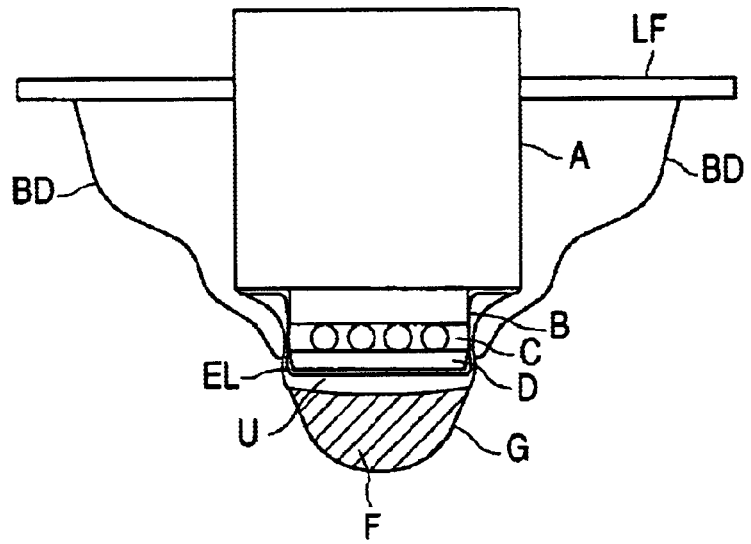
FIG. 2 shows an example of an optoelectric element in accordance with the invention.

In FIG. 2, parts corresponding to parts shown in FIG. 1 bear the same reference numerals. The electroconductive layer EL covers a part of the outside surface of heat sink A, submount B, contacts C and LED D. The electroconductive layer EL in turn is completely covered with a luminescent layer LU. As a result, not only the surface of the LED D facing away from the heat sink is covered with luminescent material but also the side surfaces extending perpendicularly thereto. To influence the direction in which the light generated by the luminescent layer is emitted, a body in the form of a hemisphere is provided on the LED D, which hemispherical body is provided with a wall G which is transparent to visible light, and with a filling F which is also transparent to visible light. If a voltage is applied between the ends of the bonding wires contacting the carrier plate LF, the LED D generates electromagnetic radiation of a first wavelength range, which is converted by the luminescent layer LU to visible light of a different wavelength range. By virtue of the presence of the wall G and the transparent filling F, the light issues substantially in the direction of the longitudinal axis of the optoelectric element.

What is claimed is:

1. An optoelectric element, comprising:
   a semiconductor light emitting device;
   an electroconductive layer covering at least a portion of said light emitting device; and
   a luminescent layer overlying and adjacent to said electroconductive layer, said luminescent layer for converting any electromagnetic radiation of a first wavelength range generated by said semiconductor light emitting device into a visible light of a different wavelength range;
   wherein the electroconductive layer has an electrical conductivity that limits an amount of current flowing through said electroconductive layer to less than 5% of any current flowing through said light emitting device.

2. The optoelectric element of claim 1, wherein said electroconductive layer is transparent to any electromagnetic radiation generated by said light emitting device.

3. The optoelectric element of claim 1, wherein said electroconductive layer includes a transparent metal oxide.

4. The optoelectric element of claim 1, wherein said electroconductive layer includes at least one oxide chosen from an oxide group formed by indium tin oxide, antimony tin oxide, and tin oxide.

5. The optoelectric element of claim 1, wherein said light emitting device is a light emitting diode.

6. The optoelectric element of claim 1, further comprising:
   a heat sink supporting said light emitting device, wherein said electroconductive layer covers each surface area of said light emitting device uncovered by said heat sink.

7. The optoelectric element of claim 6, wherein said electroconductive layer covers at least a portion of said heat sink.

8. The optoelectric element of claim 1, wherein the semiconductor light emitting device comprises:
   a substrate formed from an electrically insulating material; and
   a plurality of semiconductor layers provided on said substrate.

9. The optoelectric element of claim 1, further comprising electrodes formed on the light emitting device, wherein the electroconductive layer connects the electrodes.

10. The optoelectric element of claim 1, wherein the luminescent layer has a uniform thickness.

11. The optoelectric element of claim 1, wherein any current flowing through said electroconductive layer is at most 1% of any current flowing through said light emitting device.

12. The optoelectric element of claim 1, wherein an electric conductivity of the electroconductive layer is less than an electric conductivity of the light emitting device.

13. The optoelectric element of claim 1, wherein an electric conductivity of the electroconductive layer is greater than an electric conductivity of the luminescent layer.

14. The optoelectric element of claim 1, further comprising: a submount; and
   at least one solder ball connecting the light emitting device to the submount.

15. The optoelectric element of claim 14, wherein the submount comprises a Si wafer covered with a layer of aluminum.

16. A method for covering an optoelectric element with a luminescent layer, said method comprising:
   providing a semiconductor light emitting device;
   covering a surface of said semiconductor light emitting device with an electroconductive layer, an electric conductivity of said electroconductive layer being lower than an electric conductivity of said semiconductor light emitting device;
   bringing the electronconductive layer in contact with a suspension of luminescent material; and
   applying a voltage across the electroconductive layer and the suspension to deposit a layer of luminescent material on the electroconductive layer by an electrophoresis on the surface of the electroconductive layer, wherein the electric conductivity of said electronconductive layer is higher than an electric conductivity of the suspension of luminescent material.

17. The method of claim 16, further comprising:
   supporting said light emitting device on a heat sink; and
   covering each surface area of the light emitting device uncovered by the heat sink with the electroconductive layer.

18. The method of claim 16, wherein applying a voltage comprises maintaining a potential difference between the electroconductive layer and an electrode present in the suspension of luminescent material.

19. The method of claim 18, further comprising: covering at least a portion of the heat sink with an electroconductive layer.

20. An optoelectric element, comprising:
- a semiconductor light emitting device having a first surface, a second surface substantially parallel to said first surface, and a third surface connecting at least a portion of said first surface to a portion of said second surface;
- an electroconductive layer covering at least a portion of said first and third surfaces of the light emitting device; and
- a luminescent layer overlying said electroconductive layer, said luminescent layer for converting any electromagnetic radiation of a first wavelength range generated by said semiconductor body into a visible light of a different wavelength range.

21. The optoelectric element of claim 20, wherein any current flowing through said electroconductive layer is less than 5% of any current flowing through said light emitting device.

22. The optoelectric element of claim 20, wherein said electroconductive layer is transparent to any electromagnetic radiation generated by said light emitting device.

23. The optoelectric element of claim 20, wherein said electroconductive layer includes a transparent metal oxide.

24. The optoelectric element of claim 20, wherein said electroconductive layer includes at least one oxide chosen from an oxide group formed by indium tin oxide, antimony tin oxide, and tin oxide.

25. The optoelectric element of claim 20, wherein said light emitting device is a light emitting diode.

26. The optoelectric element of claim 20, wherein the semiconductor light emitting device comprises:
- a substrate formed from an electrically insulating material; and
- a plurality of semiconductor layers provided on said substrate.

27. The optoelectric element of claim 20, further comprising electrodes formed on the light emitting device, wherein the electroconductive layer connects the electrodes.

28. The optoelectric element of claim 20, wherein the luminescent layer has a uniform thickness.

29. The optoelectric element of claim 20, wherein any current flowing through said electroconductive layer is at most 1% of any current flowing through said light emitting device.

30. The optoelectric element of claim 20, wherein an electric conductivity of the electroconductive layer is less than an electric conductivity of the light emitting device.

31. The optoelectric element of claim 20, wherein an electric conductivity of the electroconductive layer is greater than an electric conductivity of the luminescent layer.

32. The optoelectric element of claim 20, further comprising:
- a submount; and
- at least one solder ball connecting the second surface of the light emitting device to the submount.

33. The optoelectric element of claim 32 wherein the submount comprises a Si wafer covered with a layer of aluminum.

34. The optoelectric element of claim 32, further comprising:
- a heat sink supporting said submount, wherein said electroconductive layer covers each surface area of said submount uncovered by said heat sink.

35. The optoelectric element of claim 34, wherein said electroconductive layer covers at least a portion of said heat sink.

* * * * *